United States Patent [19]
Kim

[11] Patent Number: 5,764,168
[45] Date of Patent: Jun. 9, 1998

[54] RUNLENGTH CODING METHOD AND APPARATUS FOR USE IN A VIDEO SIGNAL ENCODING SYSTEM

[75] Inventor: Jong-Han Kim, Seoul, Rep. of Korea

[73] Assignee: Daewoo Electronics Co., Ltd., Seoul, Rep. of Korea

[21] Appl. No.: 756,509

[22] Filed: Nov. 26, 1996

[30] Foreign Application Priority Data

Nov. 30, 1995 [KR] Rep. of Korea ............... 1995-45870

[51] Int. Cl.⁶ .................................................. H03M 7/46
[52] U.S. Cl. .................................................. 341/63; 341/50
[58] Field of Search .................................. 341/50, 59, 63

[56] References Cited

U.S. PATENT DOCUMENTS

| | | | |
|---|---|---|---|
| 4,327,379 | 4/1982 | Kadakia et al. | 358/261 |
| 4,684,923 | 8/1987 | Koga | 341/63 |
| 5,402,123 | 3/1995 | Jung | 341/63 |
| 5,668,547 | 9/1997 | Lee | 341/63 |

*Primary Examiner*—Marc S. Hoff
*Attorney, Agent, or Firm*—Anderson Kill & Olick, P.C.

[57] ABSTRACT

A runlength coding method converts an input data stream including a multiplicity of zeros and non-zero values to a runlength coded signal. A first sequence and a second sequence are generated based on the input data stream, and then first and second count control information and also add control information are produced based on the data in the first and the second sequences. In response to the first count control information, the number of zeros in the first sequence is calculated to thereby provide a first counted value and the number of zeros in the second sequence is computed responsive to the second count control information so as to supply a second counted value. The determined counted values are summed and provided as a runlength in response to the add control information, wherein the runlength represents the number of zeros in a run of continuous zeros preceding a non-zero value in the input data stream.

29 Claims, 3 Drawing Sheets

RUNLENGTH CODING METHOD AND APPARATUS FOR USE IN A VIDEO SIGNAL ENCODING SYSTEM

FIELD OF THE INVENTION

The present invention relates to a method and apparatus for encoding a digital video signal; and, more particularly, to an improved runlength coding method and apparatus for use in a video signal encoding system.

DESCRIPTION OF THE PRIOR ART

As is well known, transmission of digitized video signals can attain video images of a much higher quality than the transmission of analog signals. When an image signal is expressed in a digital form, a substantial amount of data is generated for transmission, especially in the case of a high definition television(HDTV) system. Since, however, the available frequency bandwidth of a conventional transmission channel is limited, in order to transmit the substantial amounts of digital data therethrough, it is inevitable to compress or reduce the volume of the transmission data.

In a modern video image transmission or processing system, a digital video signal may be coded by first obtaining a discrete cosine transform(DCT) of a block of pixels. The DCT, which reduces or removes spatial redundancies between frames of image data, converts a block of digital image data, for example, a block of 8×8 pixels, into a set of transform coefficient data. The transform coefficient data is quantized so as to take advantage of the occurrence of "zeros" and then zigzag scanned, thereby generating a stream of image data having a plurality of zeros and non-zero values. Thereafter, the data stream is subjected to a runlength coding to exploit runs of zeros in this data stream.

As shown in FIG. 1, a conventional apparatus employing the runlength coding comprises a first buffer 11, a zero value detector 12, a counter 13 and a second buffer 14. The first buffer 11 stores the data stream temporarily and sequentially supplies it to the zero value detector 12 and the second buffer 14 in parallel. The zero value detector 12 checks whether the element of the data stream fed thereto is zero or not and outputs the result to the counter 13 and the second buffer 14 as a control signal. The counter 13 counts the number of elements of the data stream detected as zero at the zero value detector 12 and outputs the number as a runlength under the instruction of the control signal. In response to the control signal from the zero value detector 12, the second buffer 14 outputs a non-zero value of the data stream as a level corresponding to the runlength retrieved from the counter 13. Consequently, the data stream is converted into a multiplicity of run-level pairs, each of the run-level pairs including a runlength and a corresponding level, wherein the runlength represents the number of zeros in a run of continuous zeros preceding a non-zero value and the level indicates the magnitude of the non-zero value following the run of continuous zeros.

Since, however, the conventional apparatus processes each element in the data stream in a series fashion, it remains desirable to develop a method of further improving the data processing speed.

SUMMARY OF THE INVENTION

It is, therefore, a primary object of the invention to provide a runlength coding method and apparatus capable of converting at an improved speed an input data stream to a multiplicity of run-level pairs.

In accordance with the present invention, there is provided a runlength coding apparatus for encoding an input data stream of image data, wherein the input data stream includes a plurality of zeros and non-zero values, which comprises: an input buffer for generating a first sequence and a second sequence of the input data stream, the first and the second sequences including (2M−1)st data and (2M)th data in the input data stream, respectively, M being a positive integer; a control circuit for providing first and second count control information and also add control information based on the data in the first and the second sequences; a first counter for calculating, in response to the first count control information, the number of zeros in the first sequence to thereby provide a first counted value; a second counter for computing, in response to the second count control information, the number of zeros in the second sequence to thereby supply a second counted value; and an addition block for summing up the first and second counted values and outputting the sum as a runlength in response to the add control information, wherein the runlength represents the number of zeros in a run of continuous zeros preceding a non-zero value in the input data stream.

BRIEF DESCRIPTION OF THE DRAWINGS

The above and other objects and features of the present invention will become apparent from the following description of preferred embodiments given in conjunction with the accompanying drawings, in which:

Figures 3A, 3B, 3C, 3D, 3E, 3F:
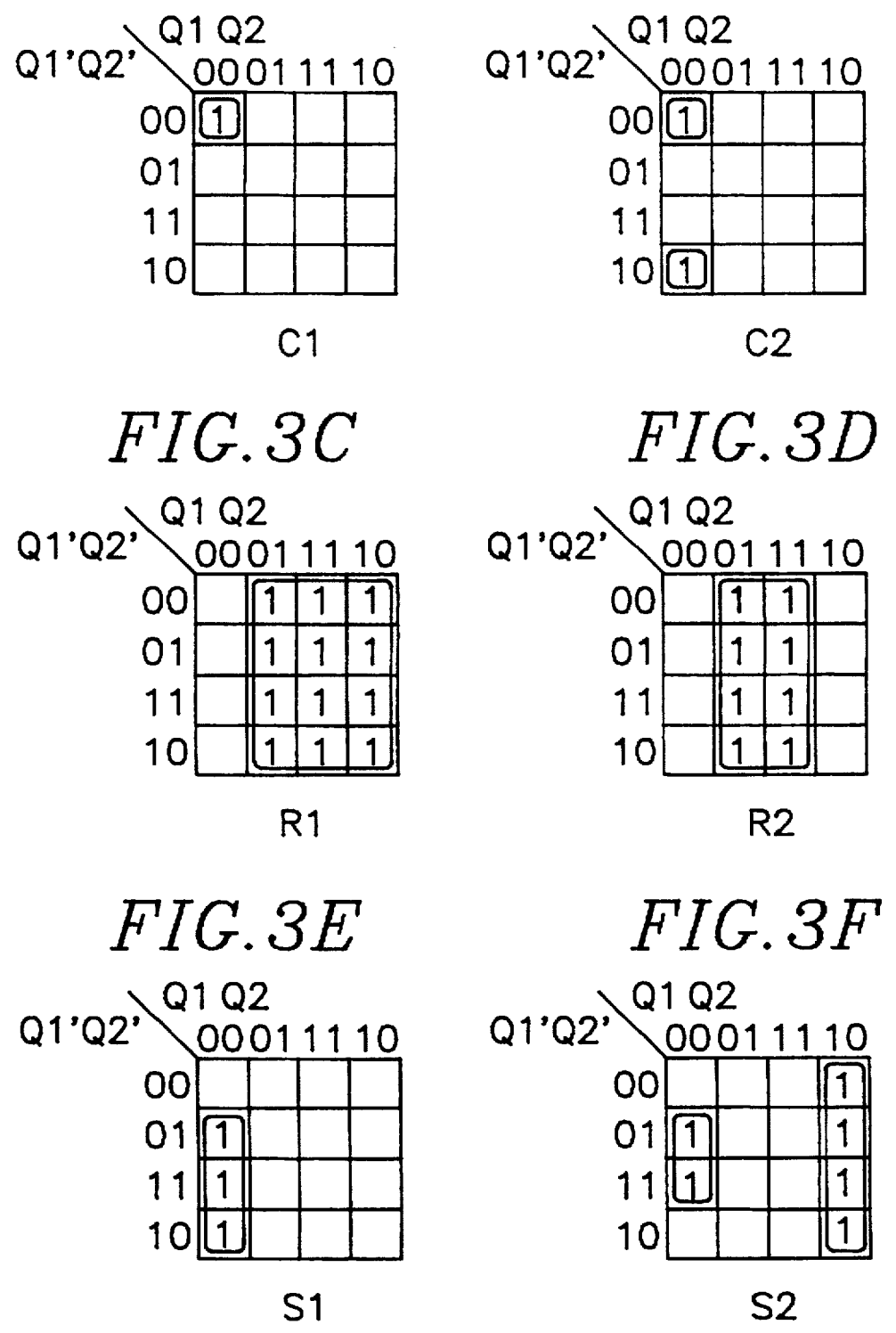

FIGS. 3A to 3F represent exemplary state maps in order to generate control signals for controlling the apparatus in FIG. 2.

DETAILED DESCRIPTION OF THE PREFERRED EMBODIMENTS

Figure 1:
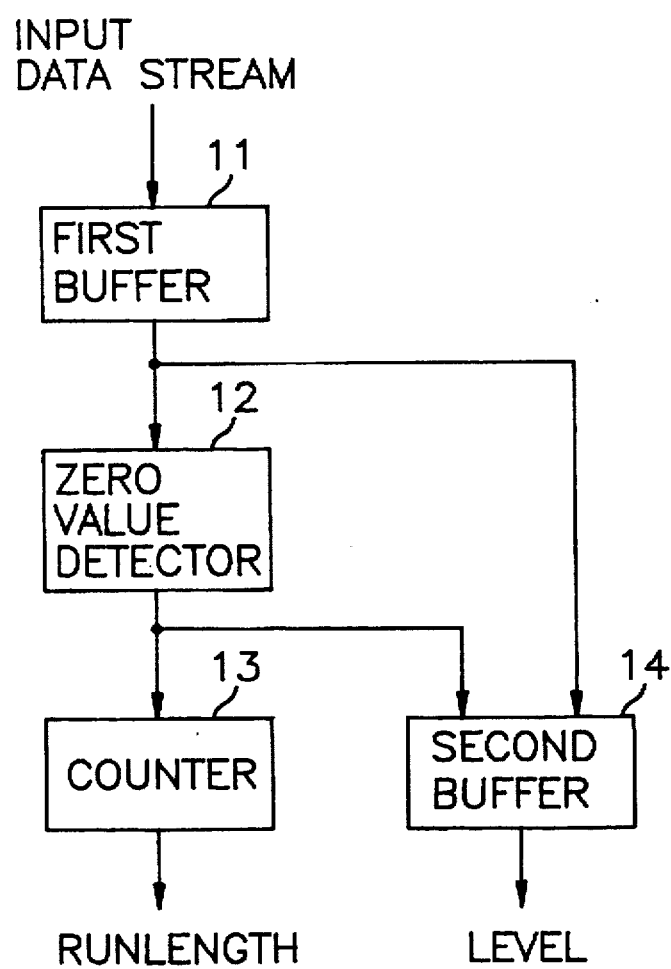
FIG. 1 shows a schematic block diagram of a conventional runlength coding apparatus.
Figure 2:
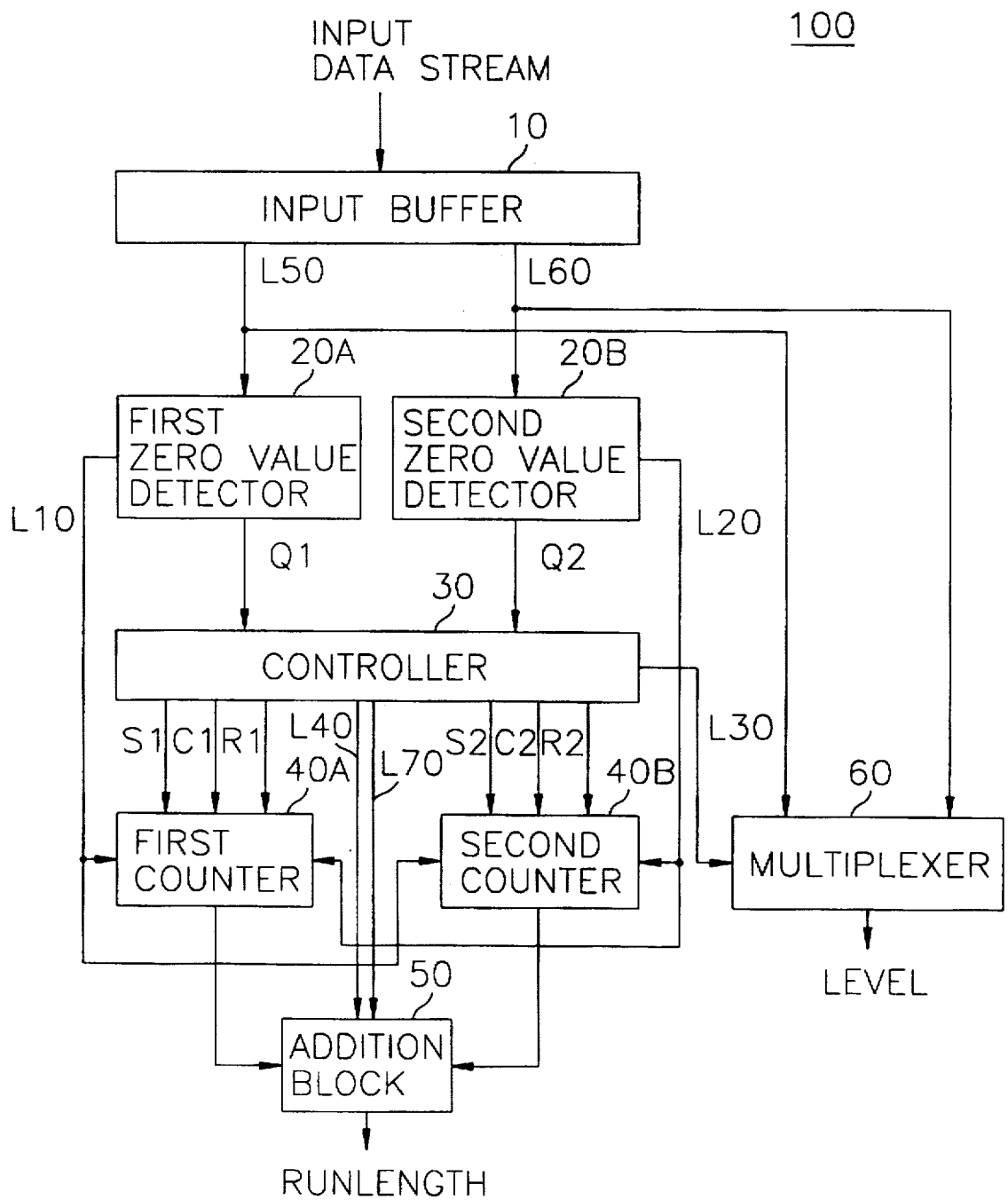
FIG. 2 depicts a runlength coding apparatus in accordance with the present invention.

Referring to FIG. 2, there is shown a runlength coding apparatus in accordance with a preferred embodiment of the present invention. The runlength coding apparatus 100 encodes an input image data stream to provide a runlength coded signal, wherein the input data stream includes a plurality of zeros and non-zero values.

As shown in FIG. 2, an input data stream is fed to an input buffer 10 for a rearrangement and temporary storage thereof. At the input buffer 10, the input data stream coupled thereto is broken up into an odd sequence and an even sequence of the input data stream, wherein the odd sequence includes (2M−1)st data of the input data stream and the even sequence has (2M)th data of the input data stream, M being a positive integer. Then, the odd sequence is coupled to a first zero value detector 20A and a multiplexer 60 via a line L50, while the even sequence is fed to a second zero value detector 20B and the multiplexer 60 via a line L60.

The first zero value detector 20A generates a current detection value Q1 with a logic low, i.e., a digit "0", to a controller 30 if the (2M−1)st data of the input data stream retrieved from the input buffer 10 is zero; and provides a logic high, i.e., a digit "1" to the same if the (2M−1)st data is a non-zero value. In the same fashion, a current detection value Q2 supplied from the second zero value detector 20B to the controller 30 varies depending on the (2M)th data of the input data stream from the input buffer 10. In the meantime, the first zero value detector 20A also generates a first write signal WRITE1 to a first and a second counters 40A and 40B through a line L10, and the second zero value detector 20B provides a second write signal WRITE2 to the first and second counters 40A and 40B through a line L20. The first and second write signals WRITE1 and WRITE2 have the same patterns as the first and second detection values Q1 and Q2, respectively.

The controller 30 generates control signals to control the first and second counters 40A and 40B, an addition block 50 and the multiplexer 60 based on the current detection values Q1 and Q2 and previous detection values Q1' and Q2' from the previous operation cycle, produced at the first and second zero value detectors 20A and 20B, respectively.

First of all, the controller 30 supplies respective counter control signals to the first and second counters 40A and 40B so as to adjust the count operation therein. Each of the counter control signals for the counters 40A and 40B includes, e.g., a set signal S, a reset signal R and a count signal C, i.e., S1, R1 and C1 for the first counter 40A and S2, R2 and C2 for the second counter 40B. The set signal S controls each counter to set a current counted value of each counter to 1; the reset signal R manages each counter to reset the current counted value to zero; and the count signal C adjusts each counter to increase a previous counted value by one to thereby update the current counted value when each of the signals S, R and C is enabled as a logic high. In order to control the counters, only one signal of the signals S, R and C for each counter is enabled at a time. The signals to be enabled for the counters are determined based on an excitation table as shown in [TABLE 1].

TABLE 1

| PREVIOUS | | CURRENT | | OUTPUT SIGNALS | |
|---|---|---|---|---|---|
| Q1' | Q2' | Q1 | Q2 | 1st | 2nd |
| 0 | 0 | 0 | 0 | C1 | C2 |
| 0 | 0 | 0 | 1 | R1 | R2 |
| 0 | 0 | 1 | 0 | R1 | S2 |
| 0 | 0 | 1 | 1 | R1 | R2 |
| 0 | 1 | 0 | 0 | S1 | S2 |
| 0 | 1 | 0 | 1 | R1 | R2 |
| 0 | 1 | 1 | 0 | R1 | S2 |
| 0 | 1 | 1 | 1 | R1 | R2 |
| 1 | 0 | 0 | 0 | S1 | C2 |
| 1 | 0 | 0 | 1 | R1 | R2 |
| 1 | 0 | 1 | 0 | R1 | S2 |
| 1 | 0 | 1 | 1 | R1 | R2 |
| 1 | 1 | 0 | 0 | S1 | S2 |
| 1 | 1 | 0 | 1 | R1 | R2 |
| 1 | 1 | 1 | 0 | R1 | S2 |
| 1 | 1 | 1 | 1 | R1 | R2 |

In the [TABLE 1], each of the output signals represents a logic high, i.e., an enabled state.

The [TABLE 1] can be described as a state map for each of the signals C1, C2, R1, R2, S1 and S2 shown in FIGS. 3A to 3F. Referring to the [TABLE 1] and the maps in FIGS. 3A to 3F, each of the output signals is depicted as follows:

$S1 = Q1'^* / Q1^* / Q2 + Q1.^* Q2'^* / Q1^* / Q2$ [EQ1-a]
$S2 = Q2'^* / Q1^* / Q2 + Q1'^* / Q2$ [EQ2-a]
$R1 = Q1 + Q1^* Q2$ [EQ1-b]
$R2 = Q2$ [EQ2-b]
$C1 = /Q1'^* / Q2'^* / Q1^* / Q2$ [EQ1-c]
$C2 = /Q2'^* / Q1^* / Q2$ [EQ2-c]

wherein /Qi and /Qi' represent the complements of Qi and Qi', respectively; and i is either 1 or 2.

In the preferred embodiment of the present invention, the controller 30 for generating the counter control signals is constructed as a gate array based on the state equations [EQ1-a] to [EQ2-c].

Therefore, the first and second counters 40A and 40B accomplish their count operations in response to the control signals from the controller 30 and output their counted values to the addition block 50 if at least one of the write signals WRITE1 and WRITE2 is enabled.

The controller 30 also provides the addition block 50 with an increment signal through a line L40 in order to increase an added counted value of the addition block 50 by one only if the current first and second detection values Q1 and Q2 from the first and second zero value detectors 20A and 20B, respectively, have digits "0" and "1", separately, wherein the added counted value is a sum of the counted values retrieved from the first and second counters 40A and 40B; and generates an add control signal, which is enabled when at least one of Q1 and Q2 has a digit 11111, to the addition block L50 through the line L70. More specially, the add control signal is produced to control the addition block 50 which outputs a previous added counted value as a runlength when the Q1, Q2 are either 0, 1 or 1, 0, respectively, and, when each of Q1 and Q2 has a digit value "1", provides a previous added counted value and a current added counted value as runlengths, respectively, the previous added counted value being a sum of counted values from the first and second counters 40A and 40B based on the previous detection values Q1' and Q2' and the current added value being determined by the current detection values Q1 and Q2.

Meanwhile, the controller 30 also provides a selecting signal via a line L30, which is enabled when at least one of Q1 and Q2 has a digit "1", to the multiplexer 60 for producing at least one non-zero value of data received from the lines L50 and L60 as a level. That is, likewise at the addition block 50, the selecting signal has a signal pattern to control the multiplexer 60 which outputs a non-zero value received from the lines L50 and L60 as a level if the Q1, Q2 are either 0,1 or 1,0, respectively, and sequentially provides non-zero values received from the lines L50 and L60 as levels if each of Q1 and Q2 has a digit "1", wherein a non-zero value from the line L60 always follows a non-zero value from the line L50.

In this way, a sequence of run-level pairs is constructed from the input data stream to thereby produce a runlength coded signal.

The operation of the runlength coding apparatus may be more readily understood with reference to an example provided below. Assuming that the input data stream inputted to the input buffer 10 shown in FIG. 2 consists of the sequence, "0, 0, 0, $1_1$, 0, 0, $1_2$, 0, 0, 0, $1_3$, $1_4$, 0, 0, ..." and both of the counters 40A and 40B are initially reset to zero, wherein $1_1$, $1_2$, $1_3$, and $1_4$ are non-zero values.

The sequence of input data stream is separated into an odd sequence and an even sequence such as "0, 0, 0, $1_2$, 0, $1_3$, 0, ..." and "0, $1_1$, 0, 0, 0, $1_4$, 0 ...", respectively, at the input buffer 10 and each value of the odd and even sequences is provided to the first and second detectors 20A and 20B and the multiplexer 60 as before-mentioned.

At the first operation cycle, the first values 0 and 0 in the odd and even sequences are coupled to the first and second zero value detectors 20A and 20B, respectively, at the same time. Then, the first zero value detector 20A produces the first detection value Q1 with a digit "0" and the second zero value detector 20B supplies the second detection value Q2 of a digit "0" based on the first values 0 and 0. In the mean time, the first and second zero value detectors 20A and 20B also generate the first and second write signals WRITE1 and WRITE2 with a logic low, i.e., disabled. The controller 30 provides enabled set signals S1 and S2 to the first and second counters 40A and 40B, separately, by comparing the current detection values Q1 and Q2 having a digit "0" with the initial detection values Q1' and Q2', which are initially set to a digit "1"; supplies disabled increment and add control signals to the addition block 50 to thereby prevent the addition block 50 from providing a previous or current added counted value as a runlength; and also controls the multiplexer 60 to be incapacitated by a disabled selecting signal. Then, the first and second counters 40A and 40B produce current counted values 1's in response to the enabled set signals S1 and S2, respectively. The current counted values, i.e., 1 and 1 generated at the first and second counters 40A and 40B are temporarily stored therein as previous counted values until a next enabled write signal is coupled thereto since the counters 40A and 40B cannot transfer the current counted values to the next device due to the disabled current write signals WRITE1 and WRITE2. In the above operation cycle, the current detection values Q1 and Q2 used at the controller 30 are also stored at the controller 30 to be used as the previous detection values Q1' and Q2' at the next operation cycle.

In the same manner as at the first operation cycle, at the second operation cycle, the second values 0 and $1_1$ of the odd and even sequences, respectively, are separately coupled to the first and second zero value detectors 20A and 20B. The first and second zero value detectors 20A and 20B produce the current detection values Q1 and Q2 having digits "0" and "1", respectively; and, also generate the first write signal WRITE1 disabled and the second write signal WRITE2 enabled. The controller 30 provides the enabled R1 and R2 signals to the first and second counters 40A and 40B, individually, according to the [TABLE 1], by comparing the current detection values Q1, Q2 having 0, 1 with the previous detection values Q1', Q2' containing 0, 0 generated during the first operation cycle and stored at the controller 30; supplies enabled increment and add control signals to the addition block 50, wherein, as before-mentioned, the increment signal is enabled because the current detection values Q1 and Q2 have respective digits "0" and "1"; and also outputs an enabled selecting signal to the multiplexer 60. Accordingly, the addition block 50 increases the previous added counted value by one and outputs the increased value, i.e., 3 as a runlength at that time, the previous added counted value being a sum of the counted values from the counters 40A and 40B, i.e., 2 because the counted values of the counter 40A and 40B were set as 1 at the previous operation cycle by the enabled signals S1 and S2. Meanwhile, the multiplexer 60 provides the non-zero value 11 as a level in response to the enabled selecting signal from the controller 30. Then, the counter 40A and 40B are reset by the enabled signals R1 and R2. As a result of the second operation cycle, a run-level pair $(3, 1_1)$ having the run-length 3 and the level 11 is produced.

At the third operation cycle, the first and second zero value detectors 20A and 20B produce the current detection values Q1 and Q2, each having a digit "0", and the disabled write signals WRITE1 and WRITE2 based on the third values 0 and 0 of the odd and even sequences fed thereto, respectively. At the controller 30, the enabled S1 and S2 signals are produced based on Q1', Q2' having 0, 1 and Q1, Q2 with 0, 0, respectively, as shown in the [TABLE 1]; disabled increment and add control signals are supplied to the addition block 50; and a disabled selecting signal is coupled to the multiplexer 60. Thereafter, the addition block 50 does not output any added counted value due to the disabled add control signal and the multiplexer 60 is also incapacitated in response to the disabled selecting signal. Then, the counter 40A and 40B are set by the enabled signals S1 and S2 and, thus, the counted values 1's are stored at the first and second counters 40A and 40B, separately, as the previous counted values.

During the fourth operation cycle, the fourth values $1_2$ and 0 of the odd and even sequences are transferred to the first and second zero value detectors 20A and 20B. Accordingly, Q1 having a digit "1" and Q2 containing a digit "0" are produced and an enabled WRITE1 signal and a disabled WRITE2 signal are generated. Based on the Q1, Q2, WRITE1 and WRITE2 signals, the controller 30 provides enabled R1 and S2 signals to the first and second counters 40A and 40B, respectively; supplies an enabled add control signal to the addition block 50; and outputs an enabled selecting signal to the multiplexer 60. The addition block 50 calculates a sum of the previous counted values, e.g., 1 and 1, of the first and second counter 40A and 40B and outputs the sum, i.e., 2 as a runlength responsive to the enabled add control signal from the controller 30. Concurrently, the multiplexer 60 provides the non-zero value $1_2$ as a level under the control of the enabled selecting signal from the controller 30. Then, the first counter 40A is reset by R1 and the second counter 40B is set by S2. Through the fourth operation cycle, a second run-level pair $(2, 1_2)$ is constructed.

The fifth operation cycle based on the fifth values 0 and 0 retrieved from the input buffer 10 is also accomplished in the similar manner as used in the above operations. That is, since Q1', Q2', Q1 and Q2 have corresponding values 1, 0, 0 and 0, S1 and C2 are enabled as shown in the [TABLE 1] and both WRITE1 and WRITE2 are disabled. Therefore, the addition block 50 and the multiplexer 60 do not provide a runlength and a level. The first counter 40A contains a counted value 1 by being set and the second counter 40B has a counted value 2 by incrementing the previous counted value 1 by one.

At a subsequent cycle, the non-zero values $1_3$ and $1_4$ are fed to the first and second zero value detectors 20A and 20B and, thus, enabled write signals WRITE1 and WRITE2 are produced to thereby operate on the first and second counters 40A and 40B. And, the controller 30 generates enabled R1 and R2 signals. Since, however, at this operation cycle, each of the detection values Q1 and Q2 has a value "1", the add control signal and the selecting signal have to be enabled twice to thereby sequentially output the non-zero values $1_3$ and $1_4$ as a level, wherein the twice enabled add control signal and the selecting signal need to have an appropriate time interval between the first and second enabled signals, the time interval being long enough for the current counted values to be determined at the first and second counters 40A and 40B by the enabled R1 and R2 signals, separately. That is, the first enabled add control and selecting signals control the addition block 50 and the multiplexer 60 to construct a first run-level pair based on the non-zero value $1_3$ and the previous counted values, i.e., 1 and 2 stored at the first and second counters 40A and 40B. On the other hand, the second enabled add control and selecting signals have the addition block 50 and the multiplexer 60 to generate a second run-level pair based on the non-zero value $1_4$ and the current counted values, i.e., 0 and 0 respectively produced at the first and second counters 40A and 40B by the enabled signals R1 and R2. Hence, at this operation cycle, the apparatus 100 provides two run-level pairs, a first one $(3, 1_3)$ and a second one $(0, 1_4)$.

The rest of the outputs of the input buffer 10 are also converted to a sequence of run-level pairs through the same or similar manner as used at the above processes based on the [TABLE 1].

As a result, the sequence "0, 0, 0, $1_1$, 0, 0, $1_2$, 0, 0, 0, 13, $1_4$, 0, 0, . . . " is converted to run-level pairs (3, $1_1$), (2, $1_2$), (3, $1_3$), (0, $1_4$), etc. to thereby produce the runlength coded signal through the runlength coding method and apparatus proposed by the present invention.

While the present invention has been shown and described in connection with the preferred embodiments only, it will be readily apparent to those of ordinary skill in the art that many changes and modifications may be made without departing from the spirit and scope of the invention as defined in the appended claims.

What is claimed is:

1. An apparatus for runlength-coding a stream of input data, wherein the input data stream includes a plurality of zeros and non-zero values, which comprises:

a buffering means for generating a first sequence and a second sequence of the input data stream, the first and the second sequences including (2M–1)st data and (2M)th data in the input data stream, respectively, M being a positive integer;

a control means for providing first and second count control information and also add control information based on the data in the first and the second sequences;

a first counting means for calculating, in response to the first count control information, the number of zeros in the first sequence to thereby provide a first counted value;

a second counting means for computing, in response to the second count control information, the number of zeros in the second sequence to thereby supply a second counted value; and an adding means for summing up the first and second counted values and outputting the sum as a runlength in response to the add control information, wherein the runlength represents the number of zeros in a run of continuous zeros preceding a non-zero value in the input data stream.

2. The apparatus as recited in claim 1, wherein the control means includes:

a first detection means for detecting whether each of the data in the first sequence is zero or not to thereby produce a first current detection value Q1;

a second detection means for noticing if each of the data in the second sequence is zero or not, thereby providing a second current detection value Q2;

means for temporarily storing previous detection values Q1' and Q2' generated prior to the current detection values Q1 and Q2;

means for producing the first and second count control information based on the previous detection values Q1' and Q2' and the current detection values Q1 and Q2; and means for creating the add control information based on the current detection values Q1 and Q2.

3. The apparatus as recited in claim 2, wherein each of the current detection signals Q1, Q2 has a digit 0 if each of the data in the first and the second sequences is zero and, if otherwise, it has a digit 1.

4. The apparatus as recited in claim 2, wherein the count control information for each counting means includes a set signal S for setting a counted value to one, a reset signal R for resetting said counted value to zero and a count signal C for increasing said counted value by one, the signals S, R and C being selectively enabled according to the previous detection values Q1' and Q2' and the current detection values Q1 and Q2.

5. The apparatus as recited in claim 4, wherein each signal included in the first count control information is enabled according to equations as follows:

$$S=Q1'*/Q1*/Q2+/Q1'*Q2'*/Q1*/Q2$$

$$R=Q1+/Q1*Q2$$

$$C=/Q1'*/Q2'*/Q1*/Q2$$

wherein /Qi and /Qi' represent the complements of Qi and Qi', separately; and i is either 1 or 2.

6. The apparatus as recited in claim 5, wherein each signal included in the second count control information is enabled according to equations as follows:

$$S=Q2'*/Q1*/Q2+Q1*/Q2$$

$$R=Q2$$

$$C=/Q2'*/Q1*/Q2.$$

7. The apparatus as recited in claim 6, wherein the add control information includes an increment signal and an output signal, the increment signal making the adding means increase the sum of the first and second counted values by one and the output signal controlling the adding means to output the sum as the runlength when each of them is enabled.

8. The apparatus as recited in claim 7, wherein said increment signal is enabled only if current detection values Q1 and Q2 have digits 0 and 1, respectively, and said output signal is enabled if at least one of the detection values Q1 and Q2 is a digit 1.

9. The apparatus as recited in claim 8, wherein said output signal includes a first and a second output control signals and also includes a time interval between the first and second output control signals, the first output control signal being enabled if either Q1 or Q2 has a digit 1, both of the output control signals being enabled if each of Q1 and Q2 has a value 1, and the time interval having to be long enough for the first and second counting means to be operated by the first and second count control information, separately.

10. An apparatus for runlength-coding a stream of input data, wherein the input data stream includes a plurality of zeros and non-zero values, which comprises:

a buffering means for generating a first sequence and a second sequence of the input data stream, the first and the second sequences including (2M–1)st data and (2M)th data in the input data stream, respectively, M being a positive integer;

a control means for providing first and second count control information, add control information and a selecting signal based on the data in the first and the second sequences;

a first counting means for calculating, in response to the first count control information, the number of zeros in the first sequence to thereby provide a first counted value;

a second counting means for computing, in response to the second count control information, the number of zeros in the second sequence to thereby supply a second counted value;

an adding means for summing up the first and second counted values and outputting the sum as a runlength in response to the add control information, wherein the runlength represents the number of zeros in a run of continuous zeros preceding a non-zero value in the input data stream; and means for outputting a non-zero value in the input data stream as a level responsive to the selecting signal, wherein the level indicates the magnitude of the non-zero value following the run of continuous zeros in the input data stream.

11. The apparatus according to claim 10, wherein the control means includes:

a first detection means for detecting whether each of the data in the first sequence is zero or not to thereby produce a first current detection value Q1;

a second detection means for noticing if each of the data in the second sequence is zero or not, thereby providing a second current detection value Q2;

means for temporarily storing previous detection values Q1' and Q2' generated prior to the current detection values Q1 and Q2;

means for producing the first and second count control information based on the previous detection values Q1' and Q2' and the current detection values Q1 and Q2; and means for creating the add control information and the selecting signal based on the current detection values Q1 and Q2.

12. The apparatus according to claim 11, wherein each of the current detection signals Q1, Q2 has a digit 0 if each of the data in the first and the second sequences is zero and, if otherwise, it has a digit 1.

13. The apparatus according to claim 11, wherein the count control information for each counting means includes a set signal S for setting a counted value to one, a reset signal R for resetting said counted value to zero and a count signal C for increasing said counted value by one, the signals S, R and C being selectively enabled according to the previous detection values Q1' and Q2' and the current detection values Q1 and Q2.

14. The apparatus according to claim 13, wherein each signal included in the first count control information is enabled according to equations as follows:

S=Q1'*/Q1*/Q2+/Q1'*Q2'*/Q1*/Q2

R=Q1+/Q1*Q2

C=/Q1'*/Q2'*/Q1*/Q2 wherein /Qi and /Qi' represent the complements of Qi and Qi', separately; and i is either 1 or 2.

15. The apparatus according to claim 14, wherein each signal included in the second count control information is enabled according to equations as follows:

S=Q2'*/Q1*/Q2+Q1*/Q2

R=Q2

C=/Q2'*/Q1*/Q2.

16. The apparatus according to claim 15, wherein the add control information includes an increment signal and an output signal, the increment signal making the adding means increase the sum of the first and second counted values by one and the output signal controlling the adding means to output the sum as the runlength when each of them is enabled.

17. The apparatus according to claim 16, wherein said increment signal is enabled only if current detection values Q1 and Q2 have digits 0 and 1, respectively, and said output signal is enabled if at least one of the detection values Q1 and Q2 is a digit 1.

18. The apparatus according to claim 17, wherein said output signal includes a first and a second output control signals and also includes a time interval between the first and second output control signals, the first output control signal being enabled if either Q1 or Q2 has a digit 1, both of the output control signals being enabled if each of Q1 and Q2 has a value 1, and the time interval having to be long enough for the first and second counting means to be operated by the first and second count control information, separately.

19. The apparatus according to claim 18, wherein the signal pattern of the selecting signal is same as that of the output signal.

20. A method for runlength-coding a stream of input data, wherein the input data stream includes a plurality of zeros and non-zero values, comprising the steps of:

(a) generating a first sequence and a second sequence of the input data stream, the first and the second sequences including (2M−1)st data and (2M)th data in the input data stream, respectively, M being a positive integer;

(b) providing first and second count control information and also add control information based on the data in the first and the second sequences;

(c) calculating, in response to the first count control information, the number of zeros in the first sequence to thereby provide a first counted value;

(d) computing, in response to the second count control information, the number of zeros in the second sequence to thereby supply a second counted value; and (e) summing up the first and second counted values and outputting the sum as a runlength in response to the add control information, wherein the runlength represents the number of zeros in a run of continuous zeros preceding a non-zero value in the input data stream.

21. The method of claim 20 further comprising the steps of:

(f) providing a selecting signal based on the data in the first and the second sequences; and (g) outputting a non-zero value in the input data stream as a level responsive to the selecting signal, wherein the level indicates the magnitude of the non-zero value following the run of continuous zeros in the input data stream.

22. The method of claim 20 wherein the step (b) includes:

(b1) detecting whether each of the data in the first sequence is zero or not to thereby produce a first current detection value Q1;

(b2) noticing if each of the data in the second sequence is zero or not, thereby providing a second current detection value Q2;

(b3) temporarily storing previous detection values Q1' and Q2' generated prior to the current detection values Q1 and Q2;

(b4) producing the first and second count control information based on the previous detection values Q1' and Q2' and the current detection values Q1 and Q2; and (b5) creating the add control information based on the current detection values Q1 and Q2.

23. The method of claim 22 wherein each of the current detection signals Q1, Q2 has a digit 0 if each of the data in the first and the second sequences is zero and, if otherwise, it has a digit 1.

24. The method of claim 22 wherein said each of the count control information includes a set signal S for setting a counted value to one, a reset signal R for resetting said counted value to zero and a count signal C for increasing said counted value by one, the signals S, R and C being selectively enabled according to the previous detection values Q1' and Q2' and the current detection values Q1 and Q2.

25. The method of claim 24 wherein each signal included in the first count control information is enabled according to equations as follows:

$$S = Q1'*/Q1*/Q2 + /Q1'*Q2'*/Q1*/Q2$$

$$R = Q1 + /Q1*Q2$$

$$C = /Q1'*/Q2'*/Q1*/Q2$$

wherein /Qi and /Qi' represent the complements of Qi and Qi', separately; and i is either 1 or 2.

26. The method of claim 25 wherein each signal included in the second count control information is enabled according to equations as follows:

$$S = Q2'*/Q1*/Q2 + Q1*/Q2$$

$$R = Q2$$

$$C = /Q2'*/Q1*/Q2.$$

27. The method of claim 26 wherein the add control information includes an increment signal and an output signal, the sum of the first and second counted values in the step (e) being increased by one in response to the increment signal and the sum being outputted as the runlength responsive to the output signal.

28. The method of claim 27 wherein said increment signal is enabled only if current detection values Q1 and Q2 have digits 0 and 1, respectively, and said output signal is enabled if at least one of the detection values Q1 and Q2 is a digit 1.

29. The method of claim 28 wherein said output signal includes a first and a second output control signals and also includes a time interval between the first and second output control signals, the first output control signal being enabled if either Q1 or Q2 has a digit 1, both of the output control signals being enabled if each of Q1 and Q2 has a value 1, and the time interval having to be long enough for the first and second counting means to be operated by the first and second count control information, separately.

* * * * *

UNITED STATES PATENT AND TRADEMARK OFFICE
CERTIFICATE OF CORRECTION

PATENT NO. : 5,764,168
DATED : June 9, 1998
INVENTOR(S) : Jong-Han Kim

It is certified that error appears in the above-indentified patent and that said Letters Patent is hereby corrected as shown below:

On the title page, should read;

item [30] Foreign Application Priority Data

Nov. 30, 1995   [KR]   Rep. of Korea        95-45870

Signed and Sealed this

Twenty-fifth Day of August, 1998

Attest:

BRUCE LEHMAN

*Attesting Officer*   *Commissioner of Patents and Trademarks*